United States Patent [19]

Lee et al.

[11] Patent Number: 4,607,175

[45] Date of Patent: Aug. 19, 1986

[54] NON-INVERTING HIGH SPEED LOW LEVEL GATE TO SCHOTTKY TRANSISTOR-TRANSISTOR LOGIC TRANSLATOR

[75] Inventors: Gil S. Lee, San Jose; Ashok Kumar, Saratoga, both of Calif.

[73] Assignee: Advanced Micro Devices, Inc., Sunnyvale, Calif.

[21] Appl. No.: 644,833

[22] Filed: Aug. 27, 1984

[51] Int. Cl.[4] .............. H03K 19/088; H03K 19/092; H03K 19/003; G01R 31/28
[52] U.S. Cl. .................................. 307/443; 307/456; 307/473; 307/475; 324/73 R; 371/25
[58] Field of Search ............... 307/443, 473, 475, 254, 307/456–458, 446; 371/25, 26; 324/73 R, 158 R

[56] References Cited

U.S. PATENT DOCUMENTS

| | | | |
|---|---|---|---|
| 3,736,572 | 5/1973 | Tu | 307/473 X |
| 4,042,840 | 8/1977 | Chan | 307/473 X |
| 4,255,670 | 3/1981 | Griffith | 307/473 |
| 4,287,433 | 9/1981 | Goodspeed | 307/473 |
| 4,486,674 | 12/1984 | Neely | 307/473 |
| 4,527,115 | 7/1985 | Mehrotra et al. | 371/25 X |
| 4,536,664 | 8/1985 | Martin | 307/458 X |

OTHER PUBLICATIONS

Culican et al, "Driver Circuit With Controlled Output Up-Level"; *IBM TDB*; vol. 26, No. 8, pp. 4059; 1/1984.

*Primary Examiner*—Larry N. Anagnos

*Attorney, Agent, or Firm*—Patrick T. King; Davis Chin; J. Vincent Tortolano

[57] ABSTRACT

A non-inverting high speed low level gate to Schottky transistor logic translator circuit includes a first input circuit adapted for receiving a first input signal and having its outputs connected to a first node and a second node. A first Schottky transistor is provided which has its base connected to the first node and to a voltage supply potential via a first resistor, its emitter connected to the second node and its collector connected to a third node and to the supply potential via a second resistor. A second Schottky transistor is provided which has its base coupled to the third node, its collector connected to the supply potential via a third resistor and its emitter connected to a fourth node. An upper output transistor has its base connected to the fourth node and to a ground potential via a fourth resistor, its collector connected to the supply potential via a fifth resistor and its emitter connected to an output circuit terminal. A lower output transistor has its base connected to the second node, its collector connected to the output circuit terminal and its emitter connected to the ground potential. Second and third circuits formed of low level NAND gates are adapted for receiving test input signals and have their outputs connected to the first and second nodes for testing purposes. A fourth input circuit formed of low level NAND gates is adapted for receiving a second input signal and has its outputs connected to the second node and the third node for turning off the lower output and upper output transistors so as to maintain the output circuit terminal in high impedance state.

19 Claims, 5 Drawing Figures

(a)          (b)

4,607,175

NON-INVERTING HIGH SPEED LOW LEVEL GATE TO SCHOTTKY TRANSISTOR-TRANSISTOR LOGIC TRANSLATOR

BACKGROUND OF THE INVENTION

1. Field of the Invention

This invention relates generally to Schottky transistor-transistor logic (TTL) circuitry and more particularly, it relates to a non-inverting high speed low level gate to Schottky transistor-transistor logic translator circuit which requires less power consumption and exhibits a higher noise immunity from ground and supply voltage glitches.

2. Description of the Prior Art

Conventional Schottky transistor-transistor logic circuitry of the prior art are shown in FIGS. 1(a) and 1(b) which have been labeled "Prior Art". As can be seen, these prior art circuits require the use of either a pull-down resistor R3 or a pull-down resistor-transistor network formed of resistors R3, R7 and transistor Q5 to turn off the lower output transistor Q4, thereby causing a high state at the output circuit terminal Y11. These techniques require relatively high currents and thus have a high power consumption. Further, these prior art circuits have less noise immunity against large ground and supply voltage glitches.

It would thus be desirable to provide a non-inverting high speed low level gate to Schottky transistor-transistor logic translator circuit which possesses low power consumption and high noise immunity against ground and supply voltage glitches. The translator circuit of the present invention utilizes low level NAND gates adapted to receive a lower level input signal to switch the translator so as to maintain the output in an acceptable voltage and current range.

SUMMARY OF THE INVENTION

It is a general object of the present invention to provide an improved translator circuit which operates with high speed, but yet overcomes the disadvantages of conventional Schottky TTL circuitry.

It is an object of the present invention to provide a non-inverting high speed low level gate to Schottky transistor-transistor logic translator circuit which requires less power consumption and exhibits a higher noise immunity from ground and supply voltage glitches.

It is another object of the present invention to provide an improved Schottky transistor-transistor logic translator circuit which utilizes low level NAND gates for turning off quickly a lower level output transistor so as to maintain the output in a high impedance state.

In accordance with these aims and objectives, the present invention is concerned with the provision of a non-inverting high speed low level gate to Schottky transistor-transistor logic translator circuit which includes first input means adapted for receiving a first input signal and having its output connected to a first node and a second node. A first Schottky transistor is provided which has its base connected to the first node and to the voltage supply potential via a first resistor, its emitter connected to the second node and its collector connected to a third node and to the supply potential via a second resistor. A second Schottky transistor is provided which has its base coupled to the third node, its collector connected to the supply potential via a third resistor and its emitter connected to a fourth node. An upper output transistor has its base connected to the fourth node and to a ground potential via a fourth resistor, its collector connected to the supply potential via a fifth resistor and its emitter connected to an output circuit terminal. A lower output transistor has its base connected to the second node, its collector connected to the output circuit terminal and its emitter coupled to the ground potential. Second and third input means formed of low level NAND gates are adapted for receiving test input signals and have their outputs connected to the first and second nodes. A fourth input means formed of low level NAND gates is adapted for receiving a second input signal and has its outputs connected to the second node and the third node for turning off the lower output and upper output transistors so as to maintain the output circuit terminal in a high impedance state.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 2:
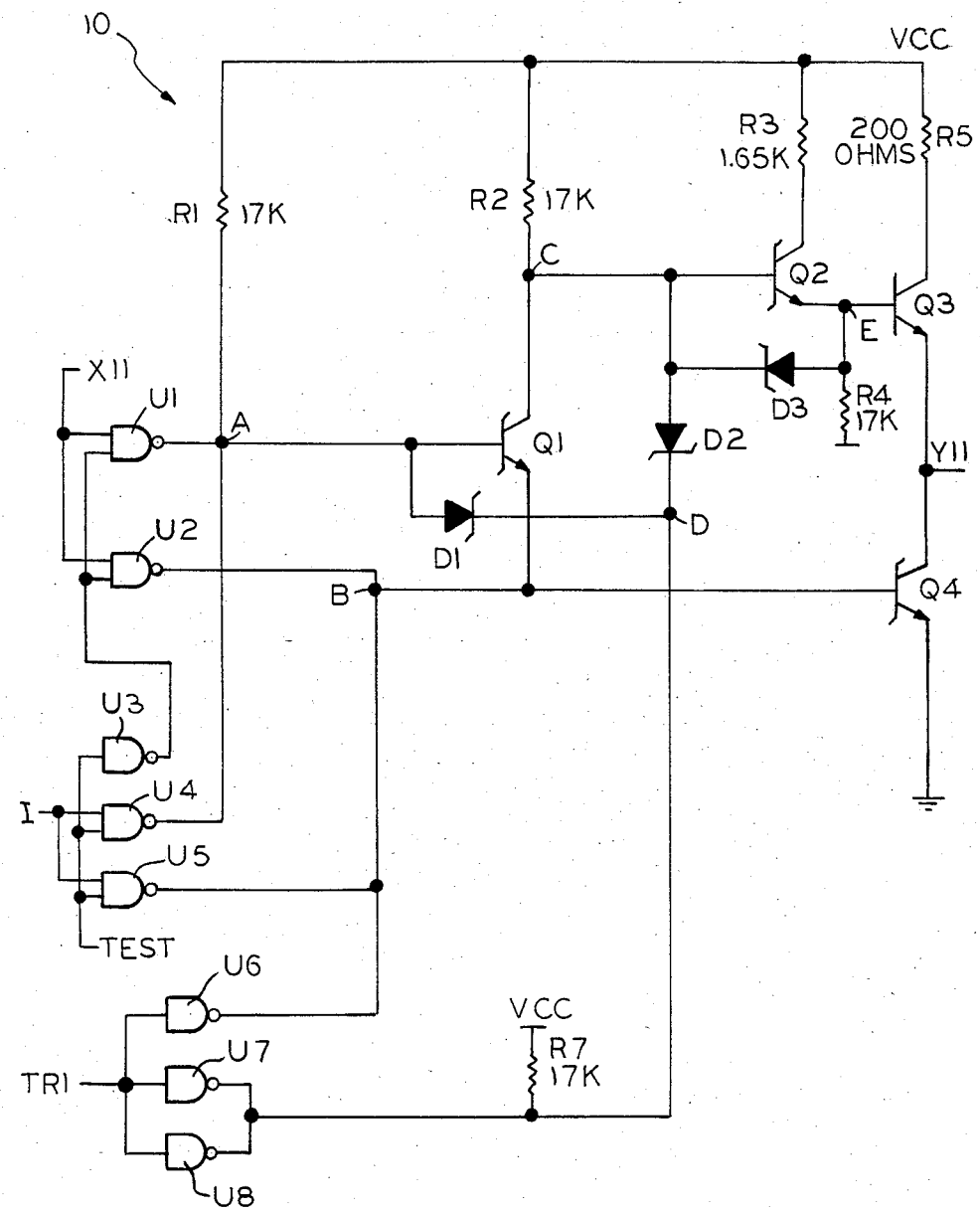
FIG. 2 is a Schottky transistor-transistor logic translator circuit, according to the present invention.

Referring now in detail to the various views of the drawings, there is shown in FIG. 2 a non-inverting high speed low level gate to Schottky transistor-transistor logic translator circuit 10 of the present invention which includes two 2-input low level NAND gates U1 and U2. An input logic signal X11 is applied to one of the two inputs of each of the NAND gate U1 and U2. An input signal TEST is applied to the input of a single-input low level NAND gate U3 whose output is fed to the other or second input of each of the NAND gate U1 and U2. The input signal TEST is also applied on one of the inputs of each two-input NAND gates U4, U5. The other or second input of the NAND gates U4, U5 receive an input signal I. An input signal TRI is connected to the input of three single-input low level NAND gates U6, U7 and U8.

A first Schottky transistor Q1 has its base connected to the outputs of the respective NAND gates U1 and U4 to form a node A and has its emitter connected to the outputs of the NAND gates U2, U5 and U6 to form a node B. A resistor R1 has its one end connected to the base of the transistor Q1 and its other end connected to a supply voltage potential VCC. The supply potential is typically a standard +5 volts for TTL circuits. A resistor R2 has its one end connected to the collector of the transistor Q1 to define a node C and its other end connected to the supply potential VCC. A Schottky diode D1 has its cathode coupled to the cathode of a Schottky diode D2 so as to form a node D. This node D is further connected to one end of a resistor R7 and to the outputs of the respective NAND gate U7 and U8. The other end of the resistor R7 is tied to the supply potential. The anode of the diode D1 is joined to the base of the transistor Q1, and the anode of the diode D2 is joined to the collector of the transistor Q1.

Second and third Schottky transistors Q2 and Q3 define an upper output stage of the translator circuit. The transistor Q2 has its base connected to one end of a resistor R2, and the other end of the resistor R2 is connected to the supply voltage potential VCC. The collector of the transistor Q2 is connected to one end of a resistor R3, and the other end of the resistor R3 is connected also to the supply potential. The emitter of the transistor Q2 is connected to the base of the transistor Q3 and to one end of a resistor R4 for forming a node E. The other end of the resistor R4 is tied to the ground potential. A Schottky diode D3 has its cathode connected to the node C and its anode connected to the node E. The collector of the transistor Q3 is coupled to one end of a resistor R5, and the other end of the resistor R5 is tied to the supply potential.

A fourth Schottky transistor Q4 defines a lower output transistor of the translator circuit. The base of the transistor Q4 is connected to the node B. The collector of the transistor Q4 is connected to the emitter of the transistor Q3 to form an output circuit terminal for producing an output Y11. The emitter of the transistor Q4 is tied to the ground potential. It should be understood by those skilled in the art that the translator circuit of the present invention may be formed as an integrated circuit on a single semiconductor chip.

Figures 3, 4:
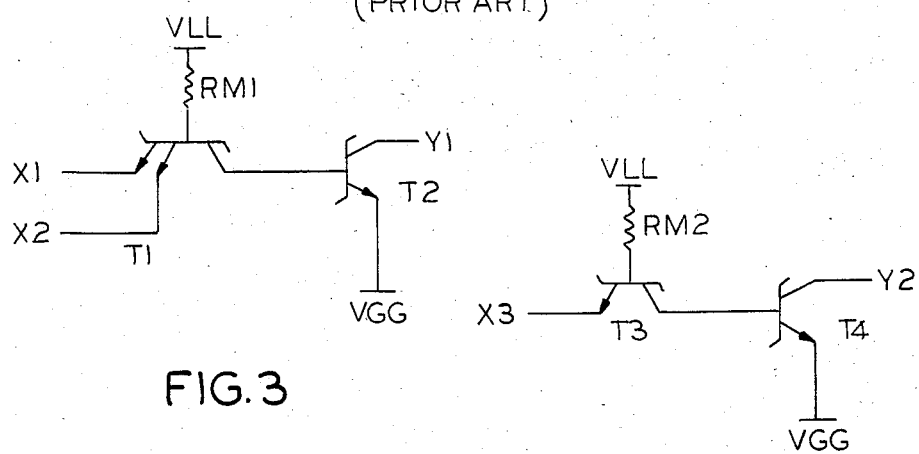
FIG. 3 is a schematic diagram of the internal details of a two-input NAND gate of FIG. 2.
FIG. 4 is a schematic of the internal details of a single-input NAND gate of FIG. 2.

The two-input NAND gates U1, U2, U4 and U5 are all identical gates and their internal details are illustrated in FIG. 3 of the drawings. As can be seen, the two input NAND gates is a basic Schottky transistor-transistor logic (TTL) circuit composed of a multi-emitter Schottky transistor T2 and a resistor RM1. The base of the transistor T1 is connected to one end of the resistor RM1, and the other end of the resistor RM1 is tied to a voltage supply potential VLL. The first emitter of the transistor T1 is coupled to a first input terminal designated as X1, and the second emitter of the transistor T1 is coupled to a second input terminal designated as X2. The collector of the transistor T1 is connected to the base of the Schottky transistor T2. The collector of the transistor T2 is tied to an output terminal designated Y1. The emitter of the transistor T2 is connected to a ground potential VGG.

The single or one-input NAND gates U3, U6, U7 and U8 are all identical gates and their internal details are depicted in FIG. 4 of the drawings. As can be seen, the one-input NAND gate consists of a pair of Schottky transistors T3, T4 and a resistor RM2. The base of the transistor T3 is connected to one end of the resistor RM2, and the other end of the resistor RM2 is tied to a voltage supply potential VLL. The emitter of the transistor T3 is coupled to an input terminal designated as X3, and the collector of the transistor T3 is coupled to the base of the Schottky transistor T4. The collector of the transistor T4 is tied to an output terminal designated as Y2, and the emitter of the transistor T4 is connected to a ground potential VGG.

The operation of the translator circuit 10 of the present invention will now be described under the normal condition where the input signals TEST and TRI are in the low level. Since the input signal TEST is low, it does not matter whether the input signal is low or high. Assuming that the input signal X11 is at a low level voltage signal, this will cause the output of the NAND gate U1 and U2 at the respective nodes A and B to be in the "high" level state so as to allow the current flowing in the resistor R1 to be driven into the base of the transistor Q1 and toward the base of the transistor Q4. Consequently, the transistor Q1 will be rendered in the conductive or turned on state and will therefore clamp the voltage at the node C to a voltage drop across the collector to emitter of the transistor Q1 above the voltage at the base of the transistor Q4. However, this voltage at the node C is not sufficient to exceed the combined voltages across the base to emitter of the transistors Q2 and Q3 required to turn them on. Thus, the transistors Q2 and Q3 will be rendered non-conductive or turned off. With the transistor Q1 being turned on, there will be sufficient base drive current to turn on the transistor Q4. As a result, the output signal Y11 will be in a "low" level state. Now assuming that the input signal X11 to the translator circuit is a high level voltage signal, the outputs of the NAND gates U1 and U2 at the respective nodes A and B will be in the "low" level. This permits the sinking of the current flowing in the resistor R1 thereby rendering non-conductive the transistor Q1 and thus discharging the base current of the transistor Q4. Accordingly, the current flowing in the resistor R2 will now be available for driving the base of the transistor Q2 and thus turns the same on. Further, this will cause a large current to flow through the resistor R3 so as to turn the transistor Q3 on also. With the transistor Q4 turned off, the voltage level at the output Y11 will be in the "high" level state.

Under TEST condition, the input signal TEST of the translator circuit 10 is made high in level. This has the effect of making the input signal I override the input signal X11. It can be seen that this is accomplished by inverting the input signal TEST via the one-input low level NAND gate U3. The output of the NAND gate U3 is utilized as the other or second input to the NAND gate U1 and U2. Thus, the input signal X11 is rendered ineffective and the translator circuit will function in a manner dependent upon the input signal I. The operation of the translator circuit with the input signal I is identical to the manner of operation for the normal condition just previously described.

In order to cause the translator circuit to operate in a high impedance state, the input signal TRI is made to be in the high level. This will override the operations under both the normal condition and the TEST condition. When the input signal TRI is high, the outputs of the NAND gate U6, U7 and U8 sink the current flowing in the transistors Q1 and Q2. This, in turn, renders both the upper output transistor Q3 and the lower output transistor Q4, non-conductive. As a result, the output Y11 at the output circuit terminal will have a high impedance state.

Figure 1:
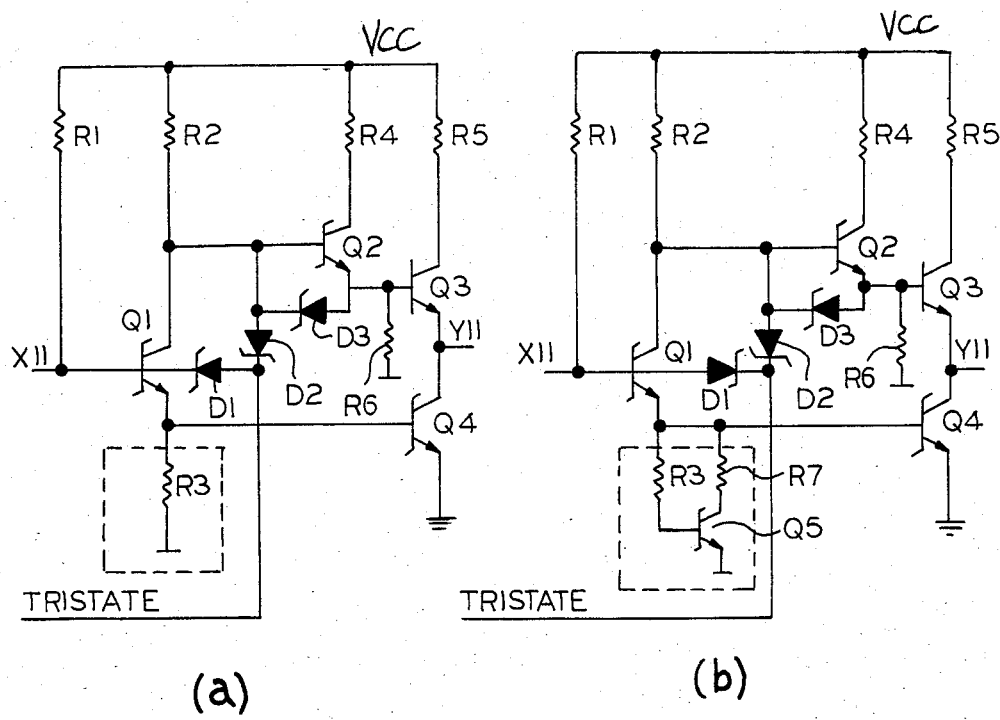
FIG. 1(a) and FIG. 1(b) are conventional Schottky TTL circuitry of the prior arts.

A conventional technique of turning off the transistor Q4 is to use a pull-down resistor R3 which is illustrated in the prior art of FIG. 1(a). Also, another prior art technique is to use a pull-down resistor-transistor network (R3, R7 and Q5) which is shown in FIG. 2(a) of the drawings. However, both of these techniques require a great deal more current than the use of the active pull-down low level gates U2, U5 and U6 of the present invention in order to obtain fast switching of transistor Q4. The lower output transistor Q4 in FIG. 2 of the present translator circuit is turned off in much less time and less power is consumed. The noise margin is increased by the amount of base to emitter voltage of transistor Q4 minus the collector to emitter voltage of the output transistors of U2, U5 and U6.

When the output Y11 is in the high impedance state, the voltage at the base of the transistor Q1 or the node A is clamped to the saturation voltage across the collector-emitter junction of the Schottky transistor T2 (FIG. 3) connected to the output terminal Y1 of the NAND gate U1. Since this voltage is much smaller than the voltage in a conventional method where the node A may have a Schottky diode or a buffer transistor switch, the present translator circuit will exhibit an increased noise immunity.

Accordingly, the translator circuit of the present invention has the following advantages over the prior art as follows:

(1) it has a faster speed of operation in both the normal and TRI state condition;
(2) it has less power consumption; and
(3) it has higher noise immunity.

From the foregoing detailed description, it can thus be seen that the present invention provides a non-inverting high speed low level gate to Schottky transistor-transistor logic translator circuit which requires less power consumption and exhibits a high noise immunity against ground and supply voltage glitches. The translator circuit of the present invention utilizes low level NAND gates for turning off quickly a lower output transistor so as to maintain the output in a high impedance state.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A non-inverting high speed low level gate to Schottky transistor-transistor logic translator circuit comprising:

a first NAND logic gate having two inputs and an output, the output of said first NAND gate being connected to a first node;

a second NAND logic gate having two inputs and an output, one input of said second NAND gate being connected to one input of said first NAND gate and to a first input circuit terminal, the output of said second NAND gate being connected to a second node;

a first Schotty transistor having its base connected to the first node and to a voltage supply potential via a first resistor, its emitter connected to the second node and its collector connected to a third node and to the supply potential via a second resistor;

a third NAND logic gate having one input and an output, the output of the third NAND gate being connected to the second input of the first and second NAND gates;

a fourth NAND logic gate having two inputs and an output;

a fifth NAND logic gate having two inputs and an output, one input of said fifth NAND gate being connected to the input of said third NAND gate, to one input of said fourth NAND gate and to a second input circuit terminal, the output of said fifth NAND gate being connected to the second node and the output of said fourth NAND gate being connected to the first node, the second input of the fourth and fifth NAND gates being connected to a third input circuit terminal;

a second Schottky transistor having its base coupled to the third node, its collector connected to the supply potential via a third resistor, and its emitter connected to a fourth node;

an upper output transistor having its base connected to the fourth node and to a ground potential via a fourth resistor, its collector connected to the supply potential via a fifth resistor and its emitter connected to an output circuit terminal; and a lower output transistor having its base connected to the second node, its collector connected to the output circuit terminal and its emitter coupled to the ground potential.

2. A translator circuit as claimed in claim 1, wherein said first NAND gate comprises a multi-emitter Schottky transistor, a second Schottky transistor and a bias resistor, said multi-emitter Shottky transistor having a first emitter connected to receive a first logic signal, a second emitter connected to receive a second logic signal, a base connected to a supply potential via the bias resistor, and a collector, said second Schottky transistor having its base connected to the collector of said multi-emitter Schottky transistor, its emitter connected to a ground potential and its collector connected to an output terminal.

3. A translator circuit as claimed in claim 2, wherein said second NAND gate comprises a multi-emitter Schottky transistor, a second Schottky transistor, and a bias resistor, said multi-emitter Schottky transistor having a first emitter connected to receive a first logic signal, a second emitter connected to receive a second logic signal, a base connected to a supply potential via the bias resistor, and a collector, said second Schottky transistor having its base connected to the collector of said multi-emitter Schottky transistor, its emitter connected to a ground potential and its collector connected to an output terminal.

4. A translator circuit as claimed in claim 3, wherein said third NAND gate comprises first and second Schottky transistors and a bias resistor, said first Schottky transistor having its emitter connected to a logic signal, its base connected to a supply potential via the bias resistor, and a collector, said second Schottky transistor having its base connected the collector of said first Schottky transistor, its emitter connected to ground potential and its collector connected to an output terminal.

5. A translator circuit as claimed in claim 4, wherein said fourth NAND gate comprises a multi-emitter Schohtky transistor, a second Schottky transistor and a bias resistor, said multi-emitter Schottky transistor having a first emitter connected to receive a first logic signal, a second emitter connected to receive a second logic signal, a base connected to a supply potential via the bias resistor, and a collector, said second Schottky transistor having its base connected to the collector of said multi-emitter Schottky transistor, its emitter connected to a ground potential and its collector connected to an output terminal.

6. A translator circuit as claimed in claim 5, wherein said fifth NAND gate comprises a multi-emitter Schottky transistor, a second Schottky transistor and a bias resistor, said multi-emitter Schottky transistor having a first emitter connected to receive a first logic signal, a second emitter connected to receive a second logic signal, a base connected to a supply potential via the bias resistor, and a collector, said second Schottky transistor having its base connected to the collector of said multi-emitter Schottky transistor, its emitter connected to a ground potential and its collector to an output terminal.

7. A translator circuit as claimed in claim 1, further comprising a first Schottky diode having its node connected to the base of said first transistor and its cathode coupled to a fifth node.

8. A translator circuit as claimed in claim 7, further comprising a second Schottky diode having its anode connected to the base of said second transistor and its cathode connected to the fifth node.

9. A translator circuit as claimed in claim 8, further comprising a third Schottky diode having its anode connected to the fourth node and its cathode connected to the third node.

10. A translator circuit as claimed in claim 1, wherein said translator circuit is formed as an integrated circuit on a single semiconductor chip.

11. A non-inverting high speed low level gate to Schottky transistor-transistor logic translator circuit comprising:
- a first NAND gate having two inputs and an output, the output of said first NAND gate being connected to a first node;
- a second NAND logic gate having two inputs and an output, one input of said second NAND gate being connected to one input of said first NAND gate and to a first input circuit terminal, the output of said second NAND gate connected to a second node;
- a first Schottky transistor having its base connected to the first node and to a voltage supply potential via a first resistor, its emitter connected to the second node and its collector to a third node and to the supply potential via a second resistor;
- a third NAND logic gate having one input and an output, the output of said third NAND gate being connected to the other input of said first and second NAND gates, the input of said third NAND gate being connected to receive an input TEST signal;
- a fourth NAND logic gate having two inputs and an output, the output of said fourth NAND gate being connected to the first node;
- a fifth NAND logic gate having two inputs and an output, one input of said fifth NAND gate being coupled to one input of said fourth NAND gate and to the input TEST signal, the other input of said fifth NAND gate being connected to the other input of said fourth NAND gate and to a second input circuit terminal;
- a sixth NAND logic gate having one input and an output, the output of a sixth NAND gate being connected to the output of said fifth NAND gate and to the second node;
- a seventh NAND logic gate having one input and an output;
- an eighth NAND logic gate having one input and an output, the input of said eighth NAND gate being connected to the input of said sixth and seventh NAND gates and to a third input circuit terminal the output of said eighth NAND logic gate being connected to the output of said seventh NAND logic gate and coupled to the second and third nodes;
- a second Schottky transistor having its base coupled to the third node, its collector connected to the supply potential via a third resistor and its emitter connected to a fourth node;
- an upper output transistor having its base connected to the fourth node and to a ground potential via a fourth resistor, its collector connected to a supply potential via a fifth resistor and its emitter connected to an output circuit terminal; and
- a lower output transistor having its base connected to the second node, its collector connected to the output circuit terminal and its emitter coupled to the ground potential.

12. A translator circuit as claimed in claim 11, wherein said first NAND gate comprises a multi-emitter Schottky transistor, a second Schottky transistor, and a bias resistor, said multi-emitter Schottky transistor having a first emitter connected to receive a first logic signal, a second emitter connected to receive a second logic signal, a base connected to a supply potential via the bias resistor, and a collector, said second Schottky transistor having its base connected to the collector of said multi-emitter Schottky transistor, its emitter connected to a ground potential and its collector connected to an output terminal.

13. A translator circuit as claimed in claim 12, wherein said second NAND gate comprises a multi-emitter Schottky transistor, a second Schottky transistor, and a bias resistor, said multi-emitter Schottky transistor having a first emitter connected to receive a first logic signal, a second emitter connected to receive a second logic signal, a base connected to a supply potential via the bias resistor, and a collector, said second Schottky transistor having its base connected to the collector of said multi-emitter Schottky transistor, its emitter connected to a ground potential and its collector connected to an output terminal.

14. A translator circuit as claimed in claim 13, wherein said third NAND gate comprises first and second Schottky transistors, and a bias resistor, said first Schottky transistor having its emitter connected to a logic signal, its base connected to a supply potential via the bias resistor and a collector, said second Schottky transistor having its base connected the collector of said first Schottky transistor, its emitter connected to a ground potential and its collector connected to an output terminal.

15. A translator circuit as claimed in claim 14, wherein each of said fourth and fifth NAND gates comprises a multi-emitter Schottky transistor, a second Schottky transistor and a bias resistor, said multi-emitter Schottky transistor having a first emitter connected to receive a first logic signal, a second emitter connected to receive a second logic signal, a base connected to a supply potential via the bias resistor, and a collector, said second Schottky transistor having its base connected to the collector of said multi-emitter Schottky transistor, its emitter connected to a ground potential and its collector connected to an output terminal.

16. A translator circuit as claimed in claim 15, wherein each of said sixth, seventh and eighth NAND gates comprises first and second Schottky transistors and a bias resistor, said first Schottky transistor having its emitter connected to a logic signal, its base connected to a supply potential via the bias resistor, and a collector, said second Schottky transistor having its base connected the collector of said first Schottky transistor, its emitter connected to a ground potential and its collector connected to an output terminal.

17. A non-inverting high speed low level gate to Schottky transistor-transistor logic translator circuit comprising:
   first input means adapted for receiving a first input signal and having its outputs connected to a first node and a second node;
   a first Schottky transistor having its base connected to the first node and to a voltage supply potential via a first resistor, its emitter connected to the second node and its collector connected to a third node and to the supply potential via a second resistor;
   a second Schottky transistor having its base connected to the third node, its collector connected to a supply potential via a third resistor and its emitter connected to a fourth node;
   an upper transistor having its base connected to the fourth node and to a ground potential via a fourth resistor, its collector connected to the supply potential via a fifth resistor and its emitter connected to an output circuit terminal;
   a lower output transistor having its base connected to the second node, its collector connected to the output circuit terminal and its emitter coupled to the ground potential;
   second and third input means formed of low level NAND gates adapted for receiving test input signals and having their outputs connected to the first and second nodes for testing purposes; and
   fourth input means formed of low level NAND gates adapted for receiving a second input signal and having its outputs connected to the second node and coupled to the third node for turning off said lower output and upper output transistors so as to maintain the output circuit terminal at a high impedance state.

18. A translator circuit as claimed in claim 17, wherein each of said low level NAND gates of said fourth input means comprise first and second Schottky transistors and a bias resistor, said first Schottky transistor having its emitter connected to a logic signal, its base connected to a supply potential via the bias resistor, and a collector, said second Schottky transistor having its base connected the collector of said first Schottky transistor, its emitter connected to a ground potential and its collector connected to an output terminal.

19. A translator circuit as claimed in claim 17, wherein said translator circuit is formed as an integrated circuit on a single semiconductor chip.

* * * * *